United States Patent
Lee et al.

(10) Patent No.: US 8,008,426 B2
(45) Date of Patent: Aug. 30, 2011

(54) ORGANIC SEMICONDUCTOR POLYMER HAVING LIQUID CRYSTAL PROPERTIES, ORGANIC ACTIVE LAYER, ORGANIC THIN FILM TRANSISTOR, AND ELECTRONIC DEVICE INCLUDING THE SAME, AND METHODS OF FABRICATING THE SAME

(75) Inventors: Eun Kyung Lee, Seoul (KR); Bang Lin Lee, Suwon-si (KR); Kook Min Han, Suwon-si (KR); Sang Yoon Lee, Seoul (KR); Eun Jeong Jeong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 582 days.

(21) Appl. No.: 12/078,952

(22) Filed: Apr. 8, 2008

(65) Prior Publication Data

US 2008/0283828 A1    Nov. 20, 2008

(30) Foreign Application Priority Data

May 16, 2007    (KR) .................. 10-2007-0047717

(51) Int. Cl.
*C08G 75/00*    (2006.01)
(52) U.S. Cl. ............... 528/373; 257/40; 257/E51.001; 528/377; 528/380
(58) Field of Classification Search ............ 257/40, 257/E51.001; 528/373, 377, 380
See application file for complete search history.

(56) References Cited

U.S. PATENT DOCUMENTS

| | | | |
|---|---|---|---|
| 5,625,199 A | 4/1997 | Baumbach et al. | |
| 5,946,551 A | 8/1999 | Dimitrakopoulos et al. | |
| 6,107,177 A | 8/2000 | Lu et al. | |
| 6,166,172 A | 12/2000 | McCullough et al. | |
| 6,232,157 B1 | 5/2001 | Dodabalapur et al. | |
| 6,452,207 B1 | 9/2002 | Bao | |
| 6,800,763 B2 * | 10/2004 | Farrand et al. ................. | 549/50 |
| 2003/0080322 A1 * | 5/2003 | Farrand et al. ........... | 252/299.62 |
| 2005/0090640 A1 | 4/2005 | Heeney et al. | |

(Continued)

FOREIGN PATENT DOCUMENTS

EP    1434285    6/2004
(Continued)

OTHER PUBLICATIONS

"Polyfluorenes as Organic Semiconductors for Polymeric Field Effect Transistors", Mat. Res. Soc. Symp. Proc. 2003, vol. 771, L6.5.1~L6.5.11, Materials Research Society.

(Continued)

*Primary Examiner* — Ken A Parker
*Assistant Examiner* — Anthony Ho
(74) *Attorney, Agent, or Firm* — Harness, Dickey & Pierce, P.L.C.

(57) ABSTRACT

Example embodiments relate to an organic semiconductor polymer, in which fused thiophenes having liquid crystal properties and aromatic compounds having N-type semiconductor properties are alternately included in the main chain of the polymer, an organic active layer, an organic thin film transistor (OTFT), and an electronic device including the same, and methods of preparing the organic semiconductor polymer, and fabricating the organic active layer, the OTFT and the electronic device using the same. This organic semiconductor polymer has improved organic solvent solubility, processability, and thin film properties, and may impart increased charge mobility and decreased off-state leakage current when applied to the channel layer of the organic thin film transistor.

15 Claims, 2 Drawing Sheets

U.S. PATENT DOCUMENTS

2007/0161776 A1* 7/2007 He ............................... 528/373

FOREIGN PATENT DOCUMENTS

| EP | 1510535 | 3/2005 |
|---|---|---|
| EP | 1754736 | 2/2007 |
| WO | WO 99/12989 | 3/1999 |
| WO | WO 00/79617 | 12/2000 |
| WO | WO 2005-111045 | 11/2005 |

OTHER PUBLICATIONS

Francis Garnier et al.: "Molecular Engineering of Organic Semiconductors: Design of Self-Assembly Properties in Conjugated Thiophene Oligomers", J. Am. Chem. Soc., 1993, vol. 115, pp. 8716~8721.

Juzo Nakayama et al., "A One-Pot Synthesis of Substituted Thieno [3,2-b] Thiophenes and Selenolo [3,2-b] Selenophenes", Heterocycles 1994, 38, p. 143.

Juzo Nakayama et al.: "Synthesis and Characterization of Dimers, Trimers, and Tetramers of 3,6-Dimethylthieno [3,2-b]thiophene and 3,6-Dimehtylselenolo[3,2-b]selenophne", Tetrahedron 1996, 52, p. 471.

F. De Jong et al.: "The Synthesis, Oxidation, and Electronics Spectra of Four Dithienothiophenes", J. Org., Chem., 1971, 36, 12, 1645, Department of Organic Chemistry.

H. Sirringhaus et al.: "Bis(dithienothiophene) Organic Field-Effect Transistors with a High on/off Ratio", Appl. Phys. Lett. 1997, 71(26), 3871.

X-C. Li et al.: "A Highly $\pi$-Stacked Organic Semiconductor for Thin Film Transistors Based on Fused Thiophenes", J. Am. Chem. Soc., 1998, 120, 2206.

John K. Stille et al.: "The Palladium-Catalyzed Cross-Coupling Reactions of Organotin Reagents with Organic Electrophiles", Angew. Chem. Int. Ed. Engl. 1986, vol. 25, pp. 508-524.

Akira Suzuki et al.: "Palladium-Catalyzed Inter-and Intramolecular Cross-Coupling Reactions . . . ", J. Am. Chem. Soc. 1989, vol. 111, pp. 314-321.

Takakazu Yamamoto et al.: "Preparation of $\pi$-Conjugated Poly(thiophene-2,5-diyl) and Related Polymers Using Zerovalent Nickel Complexes . . . " Macromolecules 1992, vol. 25, pp. 1214-1226.

S. Inaoka & D.M. Collard, "Synthesis, polymerization and characterization of substituted dithieno[3,4-*b*:3',4'-*d*]thiophenes," *J. Mater. Chem.*, 9, 1719 (1999).

European Search Report dated Feb. 23, 2009 in corresponding European Application No. 0815476.5.

* cited by examiner

ORGANIC SEMICONDUCTOR POLYMER HAVING LIQUID CRYSTAL PROPERTIES, ORGANIC ACTIVE LAYER, ORGANIC THIN FILM TRANSISTOR, AND ELECTRONIC DEVICE INCLUDING THE SAME, AND METHODS OF FABRICATING THE SAME

PRIORITY STATEMENT

This non-provisional application claims priority under U.S.C. §119 to Korean Patent Application No. 10-2007-0047717, filed on May 16, 2007, with the Korean Intellectual Property Office (KIPO), the entire contents of which are herein incorporated by reference.

BACKGROUND

1. Field

Example embodiments relate to an organic semiconductor polymer having liquid crystal properties, an organic active layer, an organic thin film transistor (OTFT), and an electronic device including the same, and methods of preparing the organic semiconductor polymer, and fabricating an organic active layer, an OTFT and an electronic device using the same. Other example embodiments relate to an organic semiconductor polymer having liquid crystal properties, in which fused thiophenes having liquid crystal properties and aromatic compounds having N-type semiconductor properties are alternately included in the main chain of the polymer, thus simultaneously imparting both increased charge mobility and decreased off-state leakage current, an organic active layer, an organic thin film transistor (OTFT), and an electronic device including the same, and methods of preparing the organic semiconductor polymer, and fabricating an organic active layer, an OTFT and an electronic device using the same.

2. Description of the Related Art

In general, an OTFT, including a substrate, a gate electrode, an insulating layer, source/drain electrodes, and a channel layer, is classified into a bottom contact (BC) type, in which the channel layer is formed on the source/drain electrodes, and a top contact (TC) type, in which a metal electrode is formed on the channel layer through mask deposition.

The channel layer of the OTFT may be formed of an inorganic semiconductor material, for example, silicon (Si). However, with the fabrication of relatively large, inexpensive, and flexible displays, the use of an organic semiconductor material, instead of an expensive inorganic material requiring a high-temperature vacuum process, may be required.

Research has been directed to organic semiconductor material for the channel layer of the OTFT, and the transistor properties thereof have been reported. Examples of low-molecular-weight or oligomeric organic semiconductor materials may include merocyanine, phthalocyanine, perylene, pentacene, C60, and thiophene oligomer. According to the related art, the use of pentacene monocrystals may result in increased charge mobilities of 3.2~5.0 cm$^2$/Vs and above. In addition, relatively increased charge mobility of 0.01~0.1 cm$^2$/Vs and on/off current ratio using an oligothiophene derivative have been reported. However, these techniques may be dependent on a vacuum process for the formation of a thin film.

Further, there may be OTFTs using an organic semiconductor polymer material, which is exemplified by a thiophene polymer. Although these OTFTs may have properties inferior to OTFTs using low-molecular-weight organic semiconductor material, processability may be improved because a relatively large area may be realized at decreased expense through a solution process, for example, a printing process. In this regard, the related art has reported the experimental fabrication of a polymer-based OTFT using a polythiophene material, called F8T2, leading to charge mobility of 0.01~0.02 cmM$^2$/Vs. As mentioned above, the organic semiconductor polymer material has TFT properties, including charge mobility, inferior to those of low-molecular-weight organic semiconductor material, including pentacene, but the organic semiconductor polymer material may eliminate the need for an increased operating frequency and may enable the inexpensive fabrication of TFTs.

With the goal of commercializing OTFTs, an increased on/off current ratio may be an important characteristic to be realized in addition to charge mobility. To this end, off-state leakage current may be minimized or reduced. The related art discloses an OTFT including an active layer composed of n-type inorganic semiconductor material and p-type organic semiconductor material to thus slightly improve the characteristics of the OTFT, which is nevertheless difficult to use in mass production because the fabrication process is similar to a conventional Si-based TFT process requiring deposition. In addition, the related art discloses an OTFT having charge mobility of 0.01~0.04 cm$^2$/Vs using regioregular poly(3-hexylthiophene) (P3HT). In the case of using poly(3-hexylthiophene) (P3HT) as a typical regioregular material, the charge mobility may be about 0.01 cm$^2$/Vs, but the on/off current ratio may be relatively low, e.g., as low as about 400 or lower, due to the increased off-state leakage current (about 10$^{-9}$ A and above), and consequently the above material is limited in application to electronic devices.

Moreover, organic semiconductor materials having liquid crystal properties capable of realizing increased charge mobility have been studied. For example, the related art discloses a semiconductor material containing (2,3-b)-thienothiophene to thus improve charge mobility, processability, and oxidation stability. Although such an organic semiconductor polymer material may function to increase charge mobility, the pi-pi conjugation length of the organic semiconductor polymer may not be effectively controlled, undesirably making it difficult to satisfy both increased charge mobility and decreased off-state leakage current.

SUMMARY

Accordingly, example embodiments provide an organic semiconductor polymer, in which fused thiophenes having liquid crystal properties and aromatic compounds having N-type semiconductor properties are alternately included in the main chain of the polymer, thus simultaneously imparting both increased charge mobility and decreased off-state leakage current, an organic active layer, an organic thin film transistor (OTFT) having increased charge mobility and decreased off-state leakage current, and an electronic device including the same, and methods of preparing the organic semiconductor polymer, and fabricating an organic active layer, an OTFT and an electronic device using the same.

Example embodiments provide an organic semiconductor polymer represented by Formula 1 below:

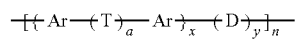

Formula 1 wherein Ar is a $C_{2-30}$ heteroaromatic ring containing one or more electron-accepting imine nitrogen atoms, one or more hydrogen atoms of the heteroaromatic ring may be substituted with Rs, in which the Rs, which are the same as or different from each other, are each a hydroxyl group, a $C_{1\sim20}$ linear, branched or cyclic alkyl group, a $C_{1\sim20}$ alkoxyalkyl group, or a $C_{1\sim16}$ linear, branched or cyclic alkoxy group, T is a group containing 2~6 fused thiophene rings, D is a $C_{4\sim14}$ hetero arylene group containing a hetero atom, other than a nitrogen atom, in an aromatic ring, or a $C_{6\sim30}$ arylene group, a is an integer from about 1 to about 4, x is an integer from about 2 to about 6, y is an integer from about 0 to about 4, and n is an integer from about 4 to about 200.

Example embodiments also provide an organic active layer, an organic thin film transistor (OTFT) having increased charge mobility and decreased off-state leakage current, and an electronic device including the same, and methods of preparing the organic semiconductor polymer, and fabricating an organic active layer, an OTFT and an electronic device using the same.

BRIEF DESCRIPTION OF THE DRAWINGS

Example embodiments will be more clearly understood from the following detailed description taken in conjunction with the accompanying drawings. FIGS. 1~3 represent non-limiting example embodiments described herein.

FIG. 2 is a graph illustrating the results of DSC (Differential Scanning Calorimetry) of the organic semiconductor polymer obtained in the preparative example of example embodiments; and FIG. 3 is a graph illustrating the current transfer properties of the device fabricated in the example of example embodiments.

Figure 1A:
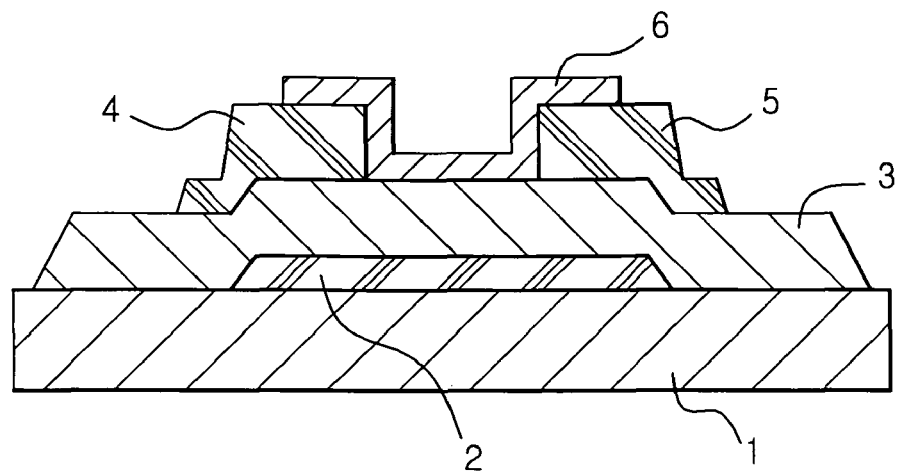
FIGS. 1A-1B are schematic cross-sectional views illustrating bottom contact type OTFT, and top contact type OTFT, respectively, according to example embodiments.

It should be noted that these figures are intended to illustrate the general characteristics of methods, structures and/or materials utilized in certain example embodiments and to supplement the written description provided below. These drawings are not, however, to scale, and may not precisely reflect the precise structural or performance characteristics of any given embodiment, and should not be interpreted as defining or limiting the range of values or properties encompassed by the example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the appended drawings. Example embodiments may, however, be embodied in many different forms and should not be construed as being limited to the embodiments set force herein. Rather, these embodiments are provided so that this disclosure will be thorough and complete, and will fully convey the scope of example embodiments to those skilled in the art.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The thiazole-containing organic semiconductor polymer of example embodiments may be represented by Formula 1 below:

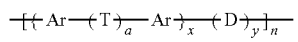

Formula 1 wherein Ar is a $C_{2~30}$ heteroaromatic ring containing one or more electron-accepting imine nitrogen atoms, one or more hydrogen atoms of the heteroaromatic ring may be substituted with Rs, in which the Rs, which are the same as or different from each other, are each a hydroxyl group, a $C_{1~20}$ linear, branched or cyclic alkyl group, a $C_{1~20}$ alkoxyalkyl group, or a $C_{1~16}$ linear, branched or cyclic alkoxy group, T is a group containing about 2~about 6 fused thiophene rings, D is a $C_{4~14}$ hetero arylene group containing a hetero atom, other than a nitrogen atom, in an aromatic ring, or a $C_{6~30}$ arylene group, a is an integer from about 1 to about 4, x is an integer from about 2 to about 6, y is an integer from about 0 to about 4, and n is an integer from about 4 to about 200.

The organic semiconductor polymer of example embodiments may have a structure including heteroaromatic rings having N-type semiconductor properties and fused thiophene rings having liquid crystal properties as a P-type semiconductor, in which the P-type semiconductors and the N-type semiconductors are alternately disposed in the main chain thereof. In addition, the structure of the polymer may further include an arylene group having P-type semiconductor properties to thus diversify the type of P-type semiconductor used in example embodiments.

The organic semiconductor polymer represented by Formula 1 may contain fused thiophene rings, thus exhibiting liquid crystal properties. As a result, the organic semiconductor polymer may be uniformly oriented and ordered and therefore allows the close packing of molecular pi-electron systems, which maximizes or increases the intermolecular charge transfer that occurs through a hopping mechanism between adjacent molecules, leading to increased charge mobility.

The organic semiconductor polymer may be structured in a manner such that the fused thiophene rings having P-type semiconductor properties and the heteroaromatic rings having N-type semiconductor properties are alternately disposed, thus minimizing or reducing off-state leakage current. For example, because the heteroaromatic rings, having N-type semiconductor properties, are disposed between the fused thiophene rings, having liquid crystal properties and thus functioning as a P-type semiconductor material, the pi-pi conjugation length in the molecule may be effectively controlled, leading to decreased off-state leakage current.

The organic semiconductor polymer may further include a compound having P-type semiconductor properties between the heteroaromatic rings having N-type semiconductor properties, thereby minimizing or reducing off-state leakage current.

In addition, the organic semiconductor polymer may include a side chain containing an alkyl group introduced in the main chain thereof, in order to increase solubility and processability.

In Formula 1, Ar, which is a $C_{2~30}$ heteroaromatic ring containing one or more electron-accepting imine nitrogen atoms, may be selected from a group represented by Formula 2 below, but example embodiments are not limited thereto:

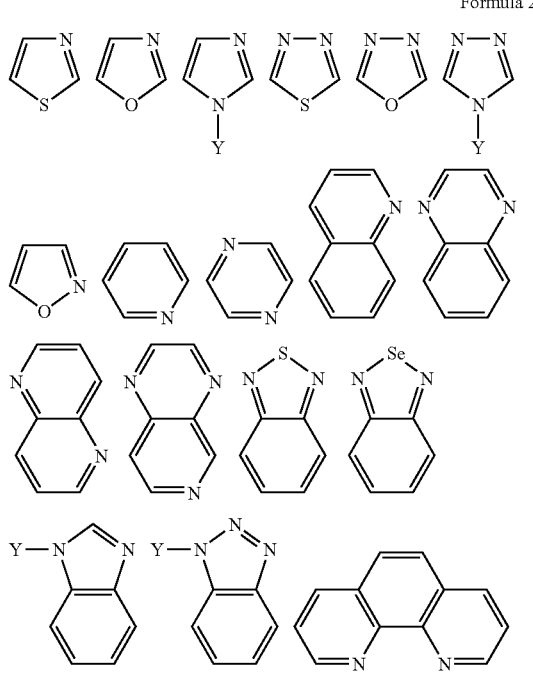

Formula 2 wherein Y is a $C_{1~20}$ linear, branched or cyclic alkyl group, an aryl group, or a $C_{1~16}$ linear, branched or cyclic alkoxy group.

Specific examples of the heteroaromatic ring may include thiazole, thiadiazole, oxazole, isoxazole, oxadiazole, imidazole, pyrazole, thiadiazole, triazole, tetrazole, pyridine, pyridazine, pyrimidine, pyrazine, triazine, quinoline, isoquinoline, quinoxaline, naphthyridine, benzoimidazole, pyrimidopyrimidine, benzothiadiazole, benzoselenadiazole, benzotriazole, benzothiazole, benzoxazole, phenanthroline, phenazine, and phenanthridine.

In Formula 1, T is a group containing about 2~about 6 fused thiophene rings, the fused thiophene ring being generally known. For example, 3,6-dimethyl thienylthiophene is disclosed in the literature of Nakayama et al. [Heterocycles 1994, 38, p. 143], and the dimer, trimer, and tetramer of 3,6-dimethyl thienylthiophene are disclosed in the literature of Nakayama et al. [Tetrahedron 1996, 52, p. 471].

Further, dithienothiophene (DTT) and α,α'-bis(dithieno[3,2-b:2',3'-d]thiophene (BDT) are disclosed in F. de Jong & M. J. Janssen, J. Org., Chem., 1971, 36, 12, 1645; S. Inaoka & D. M. Collard, J. Mater. Chem., 1999, 9, 1719; H. Sirringhaus et al., Appl. Phys. Lett. 1997, 71(26), 3871; X-C. Li et al., J. Am. Chem. Soc., 1998, 120, 2206, and WO 99/12989.

Said T of Formula 1 may be selected from a group represented by Formula 3 below, but example embodiments are not limited thereto:

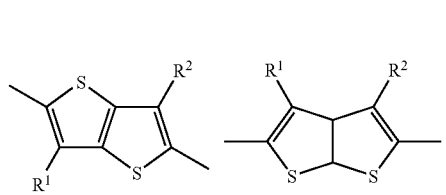

Formula 3

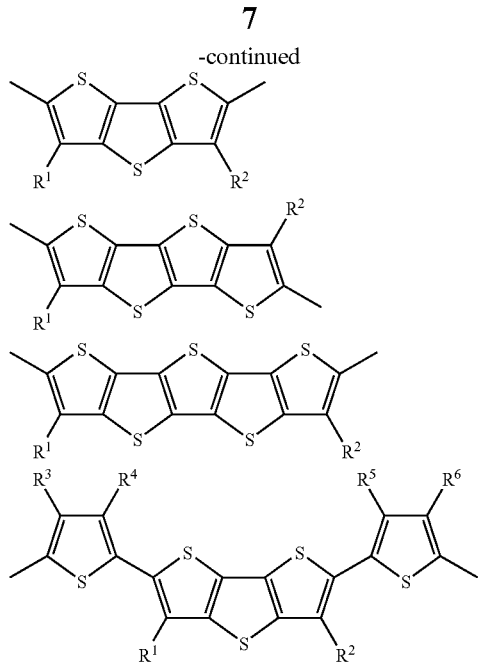

wherein $R^1$ to $R^6$, which are the same as or different from each other, are each hydrogen, a hydroxyl group, a $C_{1\sim20}$ linear, branched or cyclic alkyl group, a $C_{1\sim20}$ alkoxyalkyl group, or a $C_{1\sim16}$ linear, branched or cyclic alkoxy group.

Among compounds represented by Formula 3, said T may be thieno[3,2-b]thiophene, which enables the effective control of the pi conjugation length in the polymer semiconductor molecule to thus assure decreased leakage current, and which also has improved planar properties to thus promote pi-pi interactions, leading to increased charge mobility.

Further, the hetero arylene group of D of Formula 1 may be a 5-membered hetero arylene group substituted with one or more elements selected from among S, N—H, O, and Se, and D of Formula 1 may be substituted with a hydroxyl group, a $C_{1\sim20}$ linear, branched or cyclic alkyl group, a $C_{1\sim20}$ alkoxyalkyl group, a $C_{1\sim16}$ linear, branched or cyclic alkoxy group, or one or more elements selected from among F, Br, Cl and I.

The heteroarylene group and the arylene group may be one or more selected from a group represented by Formula 4 below, but example embodiments are not limited thereto:

Formula 4

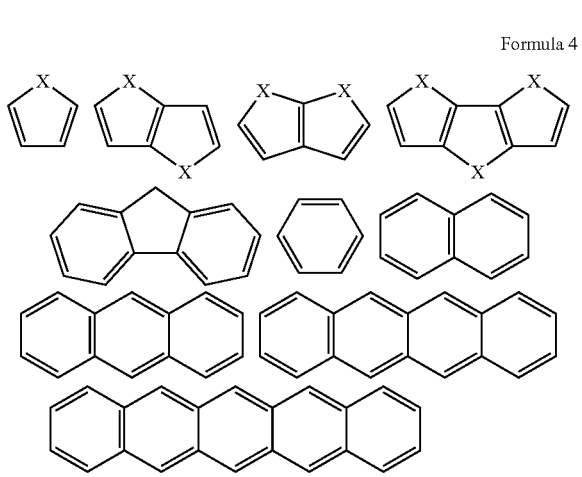

wherein X is S, N—H, O or Se.

A method of synthesizing the organic semiconductor polymer, in which y of Formula 1 is about 0, may include polymerizing a monomer represented by Formula 5 below with a monomer represented by Formula 6 below in the presence of a catalyst represented by Formula 7 or 8 below, but example embodiments are not limited thereto:

$X_1$—Ar—Ar—$X_2$     Formula 5 wherein Ar is defined as in Formula 1, and $X_1$ and $X_2$ are each a halogen atom, including Br, Cl or I, a trialkyltin group, or a borane group;

$X_3$-(T)$_a$-$X_4$     Formula 6 wherein T is a group containing about 2~about 6 fused thiophene rings, and may be selected from the group represented by Formula 3, $X_3$ and $X_4$ are each a halogen atom, including Br, Cl or I, a trialkyltin group, or a borane group, and a is an integer from about 1 to about 4;

PdL$_4$ or PdL$_2$Cl$_2$     Formula 7 wherein L is a ligand selected from the group consisting of triphenylphosphine (PPh$_3$), triphenylarsine (ASPh$_3$), and triphenylphosphite (P(OPh)$_3$); and NiL'$_2$ or NiL'Cl$_2$     Formula 8 wherein L' is a ligand selected from the group consisting of 1,5-cyclooctadiene, 1,3-diphenylphosphinopropane, 1,2-bis (diphenylphosphino)ethane, and 1,4-diphenylphosphinobutane.

Specific examples of the nickel (0) catalyst may include bis(1,5-cyclooctadiene)nickel (0) [Ni(COD)2], and examples of the nickel (II) catalyst include 1,3-diphenylphosphinopropane nickel (II) chloride[Ni(dppp)Cl$_2$], and 1,2-bis(diphenylphosphino)ethane nickel (II) chloride [Ni(dppe)Cl$_2$].

The synthesis method using the palladium or nickel catalyst represented by Formula 7 or 8 is reported by Stille et al. (*Angew. Chem. Int. Ed. Engl.* 1986, Vol. 25, pp. 508-524), Suzuki et al. (*J. Am. Chem. Soc.* 1989, Vol. 111, pp. 314-321), McCullough et al. (U.S. Pat. No. 6,166,172, 1999), or Yamamoto et al. (*Macromolecules* 1992, Vol. 25, pp. 1214-1226).

In the method of example embodiments, the polymerization may be conducted using a solvent, for example, toluene, dimethylformaldehyde (DMF), tetrahydrofuran (THF), or N-methylpyrrolidinone (NMP), at about 60° C.~about 120° C. for about 5~about 72 hours in a nitrogen atmosphere.

In addition, a method of preparing the organic semiconductor polymer, in which y of Formula 1 is about 1~about 4, may include polymerizing a monomer represented by Formula 9 below and a monomer represented by Formula 10 below, in the presence of the catalyst of Formula 7 or 8, but example embodiments are not limited thereto:

Formula 9 wherein Ar is a C$_{2\sim30}$ heteroaromatic ring containing one or more electron-accepting imine nitrogen atoms, one or more hydrogen atoms of the heteroaromatic ring may be substituted with Rs, in which the Rs, which are the same as or different from each other, are each a hydroxyl group, a C$_{1\sim20}$ linear, branched or cyclic alkyl group, a C$_{1\sim20}$ alkoxyalkyl group, or a C$_{1\sim16}$ linear, branched or cyclic alkoxy group, X$_1$ and X$_2$ are each a halogen atom, including Br, Cl or I, a trialkyltin group, or a borane group, T is a group containing about 2~about 6 fused thiophene rings and may be selected from a group represented by Formula 3 below, a is an integer from about 1 to about 4, and x is an integer from about 2 to about 6:

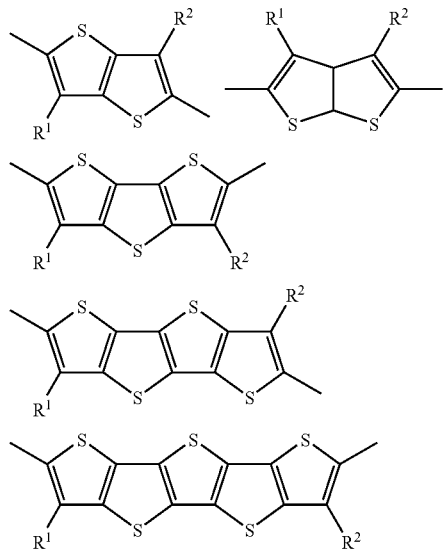

Formula 3

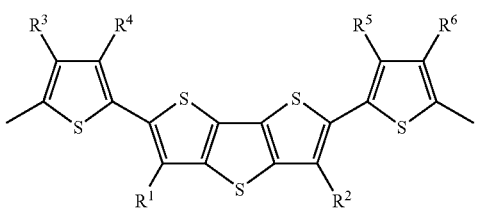

wherein R$^1$ to R$^6$ are defined as in R of Formula 9; and

Formula 10 wherein D is a C$_{4\sim14}$ hetero arylene group containing a hetero atom, other than a nitrogen atom, in an aromatic ring, or a C$_{6\sim30}$ arylene group, X$_3$ and X$_4$ are each a halogen atom, including Br, Cl or I, a trialkyltin group, or a borane group, and y is an integer from about 1 to about 4.

Typical examples of the organic semiconductor polymer represented by Formula 1 may include, but are not limited to, compounds selected from a group represented by Formula 11 below:

Formula 11

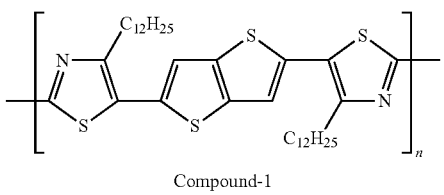

Compound-1

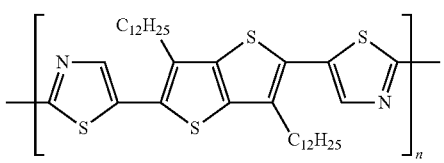

Compound-2

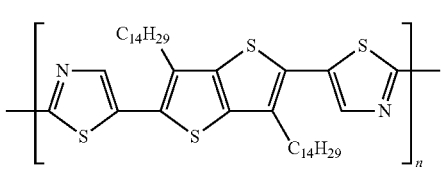

Compound-3

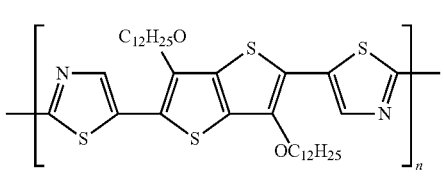

Compound-4

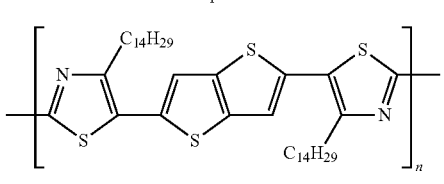

Compound-5

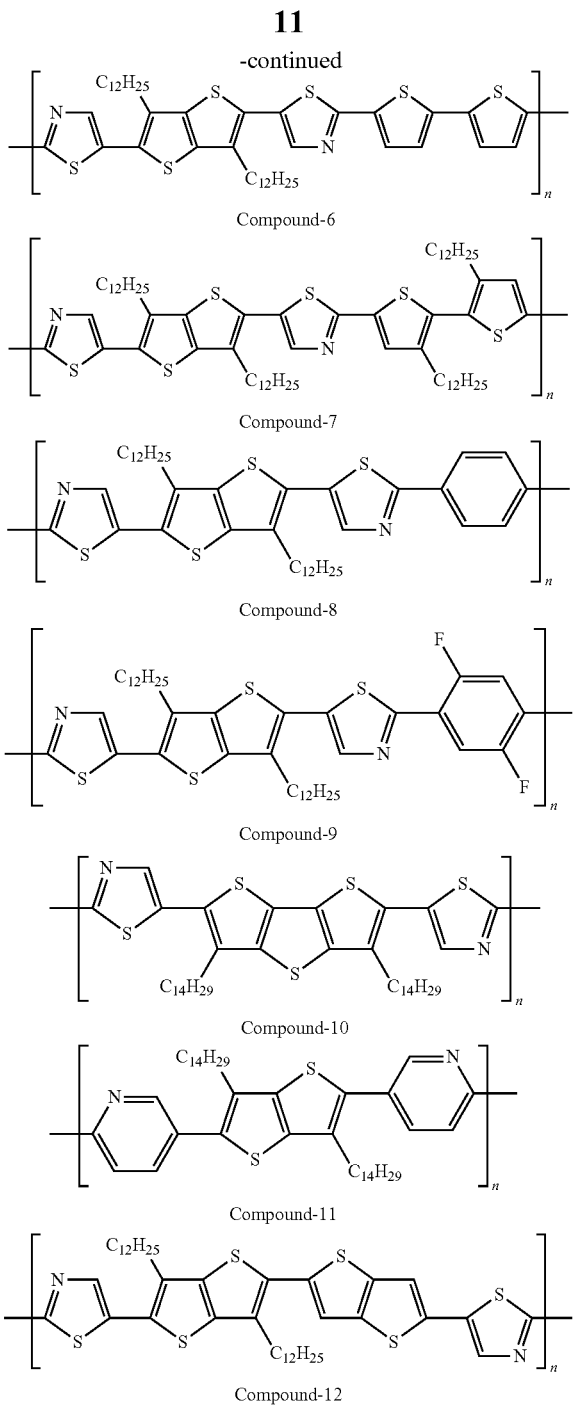

Compound-6

Compound-7

Compound-8

Compound-9

Compound-10

Compound-11

Compound-12 wherein n is an integer from about 4 to about 200.

The organic semiconductor polymer of example embodiments may have a number average molecular weight ranging from about 5,000 to about 100,000, for example, from about 10,000 to about 100,000.

The organic semiconductor polymer of example embodiments may function as a material for a charge generation layer and a charge transport layer of an electronic device, including a photovoltaic device, an organic electroluminescent device, and a sensor, but example embodiments are not limited thereto. The structure of the electronic device is known in the art, and thus a description thereof is omitted.

An OTFT may be fabricated using the organic semiconductor polymer of example embodiments as an organic semiconductor material for the active layer thereof. The organic active layer may be formed through screen printing, printing, spin coating, dipping, or ink jetting, but example embodiments are not limited thereto.

Figure 1B:
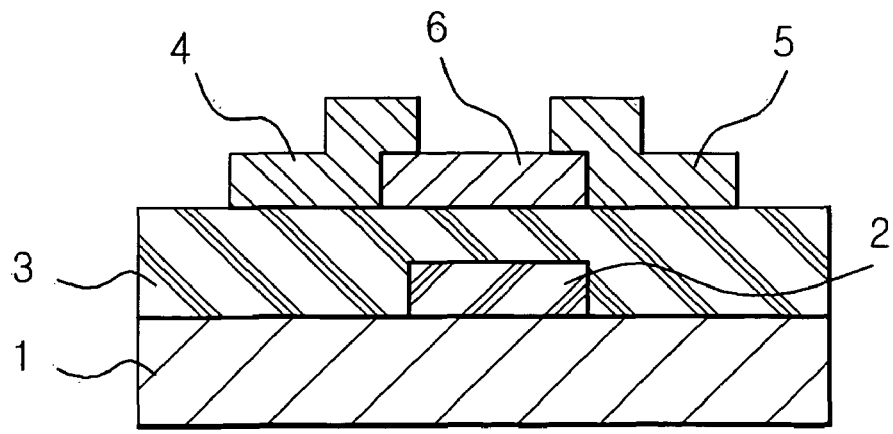

FIG. 1A is a schematic sectional view illustrating a bottom contact type OTFT, and FIG. 1B is a schematic sectional view illustrating a top contact type OTFT. The OTFT may be formed into a typically known structure, including a substrate 1, a gate electrode 2, a gate insulating layer 3, source/drain electrodes 4,5, and an organic active layer 6, as illustrated in FIG. 1A, or alternatively including a substrate 1, a gate electrode 2, a gate insulating layer 3, an organic active layer 6, and source/drain electrodes 4, 5, as illustrated in FIG. 1B, but example embodiments may not be limited thereto.

The gate insulating layer of the OTFT may be formed of a typically used insulating material having a high dielectric constant, and specific examples of the insulating material may include, but are not limited to, a ferroelectric insulator including $Ba_{0.33}Sr_{0.66}TiO_3$ (BST: Barium Strontium Titanate), $Al_2O_3$, $Ta_2O_5$, $La_2O_5$, $Y_2O_3$ and $TiO_2$, an inorganic insulator (see: U.S. Pat. No. 5,946,551) including $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON, or an organic insulator (see: U.S. Pat. No. 6,232,157) including polyimide, benzocyclobutane (BCB), parylene, polyacrylate, polyvinylalcohol and polyvinylphenol.

The gate electrode and the source/drain electrodes of the OTFT may be formed of typically used metal, and specific examples of the metal may include, but are not limited to, gold (Au), silver (Ag), aluminum (Al), nickel (Ni), and indium tin oxide (ITO).

Examples of material for the substrate of the OTFT may include, but are not limited to, glass, polyethylene naphthalate (PEN), polyethylene terephthalate (PET), polycarbonate, polyvinylalcohol, polyacrylate, polyimide, polynorbornene, and polyethersulfone (PES).

A better understanding of example embodiments may be obtained in light of the following examples, which are set forth to illustrate, but are not to be construed as limiting example embodiments.

PREPARATIVE EXAMPLE

Synthesis of Compound-1

Reaction 1

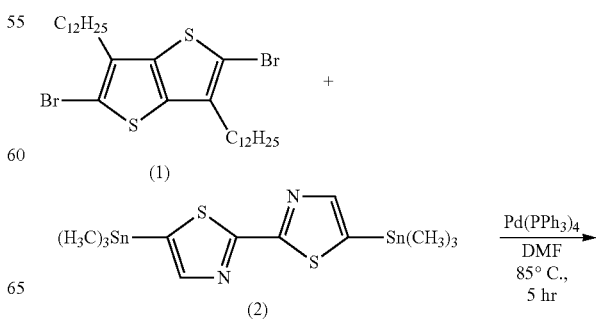

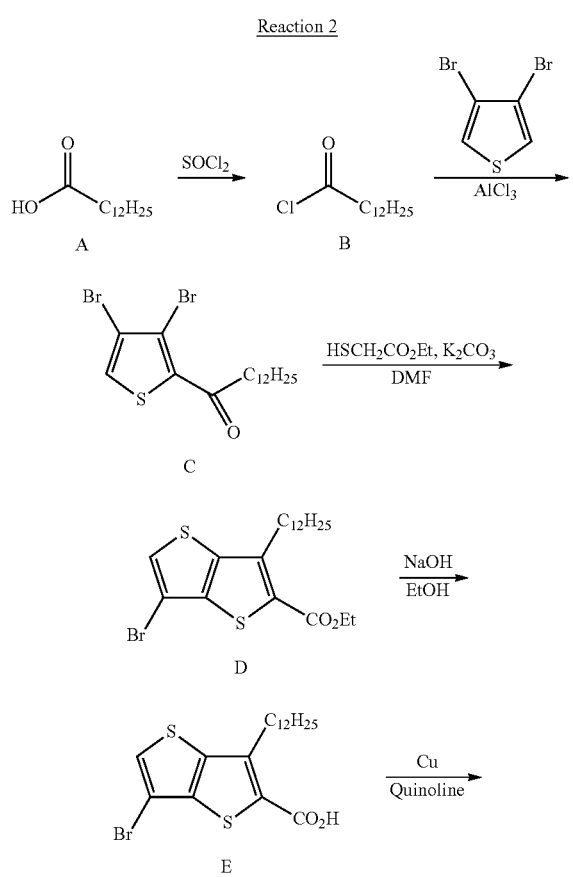

Compound-1

Compound-1 was synthesized from monomers (1) and (2) through a Yamamoto polymerization method. 2,5-dibromo-3,6-didodecyl-thieno[3,2-b]thiophene (about 0.6 g, about 0.946 mmol), as a monomer (1), and 5,5'-bis-trimethylstannyl-[2,2]bithiazolyl (about 0.47 g, about 0.946 mmol) were placed in a reactor in a nitrogen atmosphere, completely dissolved in anhydrous DMF under decreased heat conditions, added with a palladium (0) compound $Pd(PPh_3)_4$ (about 10 mol % based on the total amount of the monomers) as a polymerization catalyst, and then allowed to react at about 85° C. for about 5 hours. After the completion of the reaction, the reaction solution was cooled to about room temperature and filtered, thus obtaining a polymer solid. The polymer solid was washed two times with an aqueous hydrochloric acid solution/chloroform, two times with an aqueous ammonia solution/chloroform, and then two times with water/chloroform, reprecipitated in methanol, recovered, and dried, yielding a red compound-1 (yield: about 0.3 g, number average m.w.=about 10,000).

Preparation of Monomer (1)

Reaction 2

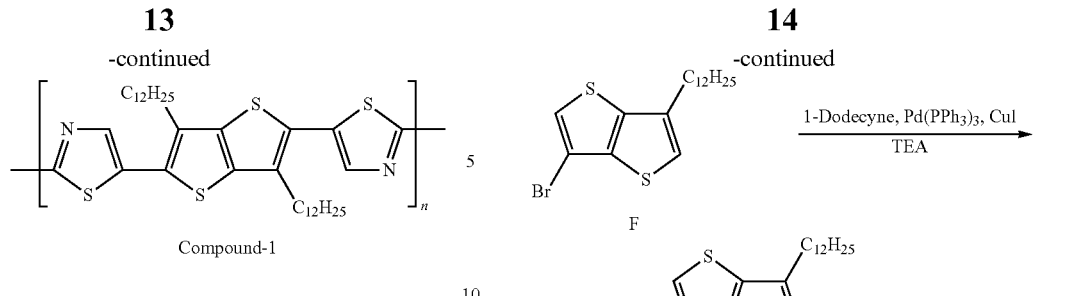

1. Synthesis of Tridecanoyl Chloride (B)

In a 1 L three-neck round-bottom flask, a compound A (tridecanoic acid) (about 35 g, about 163.3 mmol) was placed, and dissolved in $SOCl_2$ (about 300 ml). This solution was refluxed for about 2 hours, and was then cooled, after which $SOCl_2$ was concentrated under reduced pressure, thus obtaining about 39 g (y=about 99%) of tridecanoyl chloride B. $^1$H NMR of the obtained compound B was as follows.

$^1$H NMR (300 MHz, CDCl3)

δ 0.88 (t, 3H), 1.30 (m, 18H), 1.68 (m, 2H), 2.88 (t, 2H)

2. Synthesis of 1-(3,4-Dibromothiophen-2-Nyl)-Trideca-1-None (C)

In a 1 L round-bottom flask, the compound B (about 39 g, about 167 mmol) and 3,4-dibromothiophene (about 39.5 g, about 163.3 mmol) were placed, and dissolved in methylene chloride (about 500 ml). This solution was slowly added with $AlCl_3$ (about 21.8 g, about 163.3 mmol) over about 30 minutes, and was then stirred for about 3 hours. After the completion of the reaction, the stirred solution was added with distilled water (about 200 ml), and was then extracted with methylene chloride (about 300 ml). Subsequently, the organic layer was washed with an about 1 N sodium hydroxide solution, washed with brine (about 300 ml), dried over magnesium sulfate, filtered, concentrated, and then subjected to column chromatography (H:E=50:1), thus obtaining about 55.6 g (y=about 77%) of 1-(3,4-dibromothiophen-2-nyl)-trideca-1-none C. $^1$H NMR of the obtained compound C was as follows.

$^1$H NMR (300 MHz, $CDCl_3$)

δ 0.88 (t, 3H), 1.26 (m, 18H), 1.73 (m, 2H), 3.04 (t, 2H), 7.60 (s, 1H)

3. Synthesis of 6-Bromo-3-Dodecyl-Thieno[3,2-b]Thiophene-2-Carboxylethyl Ester (D)

The compound C (about 60 g, about 137 mmol) was placed in a 1 L two-neck round-bottom flask, dissolved in DMF (about 500 ml), added with potassium carbonate (about 37.8 g, about 274 mmol) and ethylthioglycolate (about 15.7 ml, about 144 mmol), and then stirred for about 24 hours. Thereafter, the stirred solution was added with a solution of sodium hydroxide (about 1.1 g) in ethanol (about 100 ml) and stirred for additional about 24 hours. The stirred solution was added with distilled water (about 500 ml), and was then extracted with ethyl acetate (about 1 L). The extracted organic layer was washed three times with distilled water (about 500 ml), washed with brine (about 500 ml), dried over magnesium sulfate, filtered, concentrated under reduced pressure, and then subjected to column chromatography (H:E=20:1), thus obtaining about 59.5 g (y=about 94%) of 6-bromo-3-dodecyl-thieno[3,2-b]thiophene-2-carboxylethyl ester D. $^1$H NMR of the obtained compound D was as follows.

$^1$H NMR (300 MHz, CDCl$_3$)

δ 0.87 (t, 3H), 1.33-1.55 (m, 21H), 1.68 (m, 2H), 3.13 (t, 2H), 4.35 (m, 2H), 7.43 (s, 1H)

4. Synthesis of 6-Bromo-3-Dodecyl-Thieno[3,2-b]Thiophene-2-Carboxylic Acid (E)

In a 1 L two-neck round-bottom flask, the compound D (about 59.5 g, about 129.5 mmol) was placed, and dissolved in ethanol (about 600 ml). The solution was added with sodium hydroxide (about 10.4 g, about 259.0 mmol), refluxed for about 1 hour to remove ethanol, dissolved in distilled water (about 500 ml), and then acidified with about 35% HCl. The solid was filtered, stirred in hexane, and further filtered, thus obtaining about 48.3 g (y=about 86%) of 6-bromo-3-dodecyl-thieno[3,2-b]thiophene-2-carboxylic acid E. $^1$H NMR of the obtained compound E was as follows.

$^1$H NMR (300 MHz, CDCl3)

δ 0.86 (t, 3H), 1.20 (m, 18H), 1.59 (m, 2H), 3.01 (t, 2H), 7.28 (s, 1H)

5. Synthesis of 6-Bromo-3-Dodecyl-Thieno[3,2-b]Thiophene (F)

In a 1 L three-neck round-bottom flask, the compound E (about 43.5 g, about 101 mmol) was placed, and dissolved in quinoline (about 250 ml), after which the solution was heated to about 200° C. and stirred for about 30 minutes. The stirred solution was cooled, and was then extracted with ethyl acetate (about 2 L), after which the extracted organic layer was washed two times with about 5 N hydrochloric acid solution (about 500 ml), washed with about 2N hydrochloric acid (about 500 ml), and washed with brine (about 500 ml). The organic layer was dried over magnesium sulfate, filtered, concentrated under reduced pressure, and then subjected to column chromatography using hexane, thus obtaining about 31.6 g (y=about 80%) of 6-bromo-3-dodecyl-thieno[3,2-b]thiophene F. $^1$H NMR of the obtained compound F was as follows.

$^1$H NMR (300 MHz, CDCl3)

δ 0.88 (t, 3H), 1.25 (m, 18H), 1.72 (m, 2H), 2.69 (t, 2H), 7.03 (s, 1H), 7.24 (d, 1H)

6. Synthesis of 3-Dodecyl-6-Dodecy-1-Nyl-Thieno[3,2-b]Thiophene (G)

In a 500 ml steel bomb, the compound F (about 27.6 g, about 71.3 mmol) was placed, and dissolved in triethylamine (about 200 ml). The solution was added with 1-dodecyne (about 23 ml, about 106.9 mmol), copper iodide (about 1.4 g, about 7.13 mmol), and palladium triphenylphosphine (about 1.65 g, about 1.4 mmol), and was then heated at about 150° C. for about 24 hours. The solution was further added with hexane (about 500 ml), and the salt was filtered through celite. The extracted organic layer was washed three times with 2 N hydrochloric acid (about 100 ml), washed with brine (about 100 ml), dried over magnesium sulfate, filtered, concentrated under reduced pressure, and then subjected to column chromatography (hexane), thus obtaining about 10.55 g (y=about 31%) of 3-dodecyl-6-dodecy-1-nyl-thieno[3,2-b]thiophene G.

7. Synthesis of 3,6-Didodecyl-Thieno[3,2-b]Thiophene (H)

In a 500 ml par bottle, the compound G (about 10.55 g, about 22.3 mmol) was placed, and dissolved in ethyl acetate (about 200 ml). The solution was added with about 10% palladium/carbon (about 2.1 g) and hydrogen (gas, about 30 psi), and was then stirred for about 24 hours. Thereafter, the stirred solution was filtered through celite, concentrated, and recrystallized using ethanol, thus obtaining about 7.76 g (y=about 72%) of 3,6-didodecyl-thieno[3,2-b]thiophene H. $^1$H NMR of the obtained compound H was as follows.

$^1$H NMR (300 MHz, CDCl3)

δ 0.88 (t, 6H), 1.25 (m, 36H), 1.74 (m, 4H), 2.70 (t, 4H), 6.95 (s, 2H)

8. Synthesis of 2,5-Dibromo-3,6-Didodecyl-Thieno[3,2-b]Thiophene (I)

In a 500 ml round-bottom flask, the compound H (about 7.76 g, about 16.3 mmol) was placed, and dissolved in methylene chloride (about 300 ml). The solution was added with N-bromosuccinimide (about 6.4 g, about 35.8 mmol), allowed to react for about 24 hours, and added with water (about 100 ml), after which the organic layer was washed with brine (about 100 ml). The organic layer was dried over magnesium sulfate, filtered, and concentrated, after which the solid was washed with methanol, thereby obtaining about 10 g (y=about 96%) of 2,5-dibromo-3,6-didodecyl-thieno[3,2-b]thiophene I. $^1$H NMR of the obtained compound I was as follows.

$^1$H NMR (300 MHz, CDCl3)

δ 0.87 (t, 6H), 1.25 (m, 36H), 1.65 (m, 4H), 2.66 (t, 4H)

Synthesis of Monomer (2)

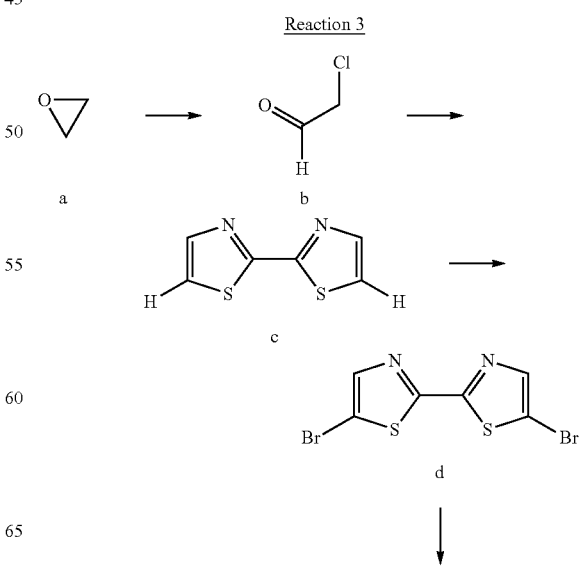

Reaction 3

-continued

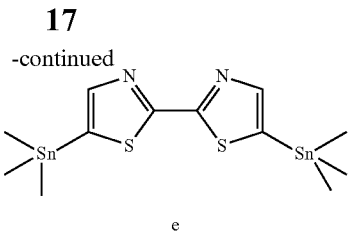

e

Synthesis of Chloroacetaldehyde (b)

1) A 1 L round-bottom flask was dried and was then filled with nitrogen.
2) About 400 ml of Methylene Chloride and dimethylsulfoxide (about 30.6 ml, about 431 mmol) were sequentially placed in the reactor, and were then cooled to about −78° C.
3) In a 500 ml round-bottom flask, about 100 ml of methylene chloride, the compound A (about 21.6 g, about 490 mmol), and about 2 ml of MeOH were placed and mixed together.
4) Oxalyl chloride (about 37 ml, about 291 mmol) was added in droplets to the solution of 2) for about 30 minutes, and the resultant solution was stirred for about 1 hour.
5) The solution of 3) was added in droplets to the solution of 4) for about 1 hour.
6) The mixed solution was stirred for about 1 hour while the temperature was maintained at about −78° C.
7) Triethylamine (about 120 ml, about 860 mmol) was added in droplets to the solution of 6) for about 2 hours, and the obtained solution was stirred for about 15 hours in a nitrogen atmosphere.
8) The reaction solution was slowly added with about 400 ml of an about 2 N hydrochloric acid solution, and was then stirred at about room temperature for about 1 hour.
9) The reaction solution was transferred into a separate funnel, after which the organic layer was separated, and was then washed with an about 2 N aqueous hydrochloric acid solution.
10) The organic layer was washed with brine and further separated, after which the obtained organic layer was dried over magnesium sulfate and was then concentrated under reduced pressure, thus obtaining about 24 g of chloroacetaldehyde b as a yellowish brown solid.

2. Synthesis of [2,2']-Bisthiazolyl (c)

The compound b (about 19.5 g, about 24.8 mmol) was dissolved in about 300 ml of ethanol in a nitrogen atmosphere, and was then added with 1,1,3,3-tetramethyl urea (about 2.8 g, about 24.8 mmol). The solution was added with dithiooximide (about 2.4 g, about 12.4 mmol) and was then refluxed for about 48 hours. This solution was added with the compound (a) (about 4 g, about 90.8 mmol) and triethyl orthoacetate (about 4 g, about 24.8 mmol), and was then refluxed for about 24 hours. The reaction solution was cooled to about room temperature, concentrated under reduced pressure, and crystallized from acetonitrile, thus obtaining about 5 g of [2,2']-bisthiazolyl c in a solid phase.

3. Synthesis of 5,5'-Dibromo-[2,2']Bithiazolyl (d)

In a reactor, the compound c (about 5 g, about 29.6 mmol) was placed, dissolved in a mixture of about 150 ml of chloroform and about 150 ml of acetic acid, added with N-bromosuccinimide (about 10.5 g, about 59.3 mmol), and then stirred for about 10 hours in a state in which the reactor was enshrouded with silver foil. After the completion of the reaction, the resultant reaction solution was filtered, and washed several times with acetonitrile. The solution was heated and crystallized using acetonitrile, thus obtaining about 4 g of 5,5'-dibromo-[2,2']bithiazolyl d in a solid phase.

4. Synthesis of 5,5'-Bistrimethylstannyl-[2,2']Bithiazolyl (e)

In a 1 L flask, the compound d (about 4 g, about 12 mmol) was placed, dissolved in THF (about 200 ml), slowly added with n-butyllithium (about 10.6 ml, about 26.4 mmol) at about −30° C., and then stirred for about 1 hour. The stirred solution was slowly added with methyltin chloride (about 25.5 ml, about 25.5 mmol) at about −78° C., stirred for about 2 hours, added with distilled water (about 200 ml), and extracted with ether (about 600 ml). The extracted organic layer was washed with brine (about 300 ml), dried over magnesium sulfate, filtered, and concentrated under reduced pressure. The resultant compound was dissolved in ether and crystallized at about −78° C., after which the solid product was dissolved in acetone and crystallized at about −10° C.~about −20° C., thus obtaining about 3.5 g (y=about 39%) of 5,5'-bistrimethylstannyl-[2,2']bithiazolyl e in a solid phase. $^1$H NMR of the obtained compound e was as follows.
$^1$H NMR (300 MHz, CDCl3)
δ 7.794 (s, 2H), 0.44 (s, 18)

EXAMPLE

Fabrication of OTFT using Compound-1

On a washed glass substrate, chromium for a gate electrode was deposited to a thickness of about 1000 Å through sputtering, after which $SiO_2$ for a gate insulating film was deposited to a thickness of about 1000 Å through CVD. Subsequently, ITO for source/drain electrodes was deposited thereon to a thickness of about 1200 Å through sputtering. Before the organic semiconductor material was deposited, the substrate was washed with isopropyl alcohol for about 10 minutes and was then dried. This sample was immersed in an octadecyltrichlorosilane solution, which had been diluted to a concentration of about 10 mM using chloroform, for about 30 seconds, washed with acetone, and dried, after which the compound-1 synthesized in the preparative example was dissolved to a concentration of about 1 wt % in chloroform, applied to a thickness of about 1000 Å at about 1000 rpm, and baked at about 100° C for about 1 hour in an argon atmosphere, thus fabricating the OTFT of FIG. 1A.

Figure 2:
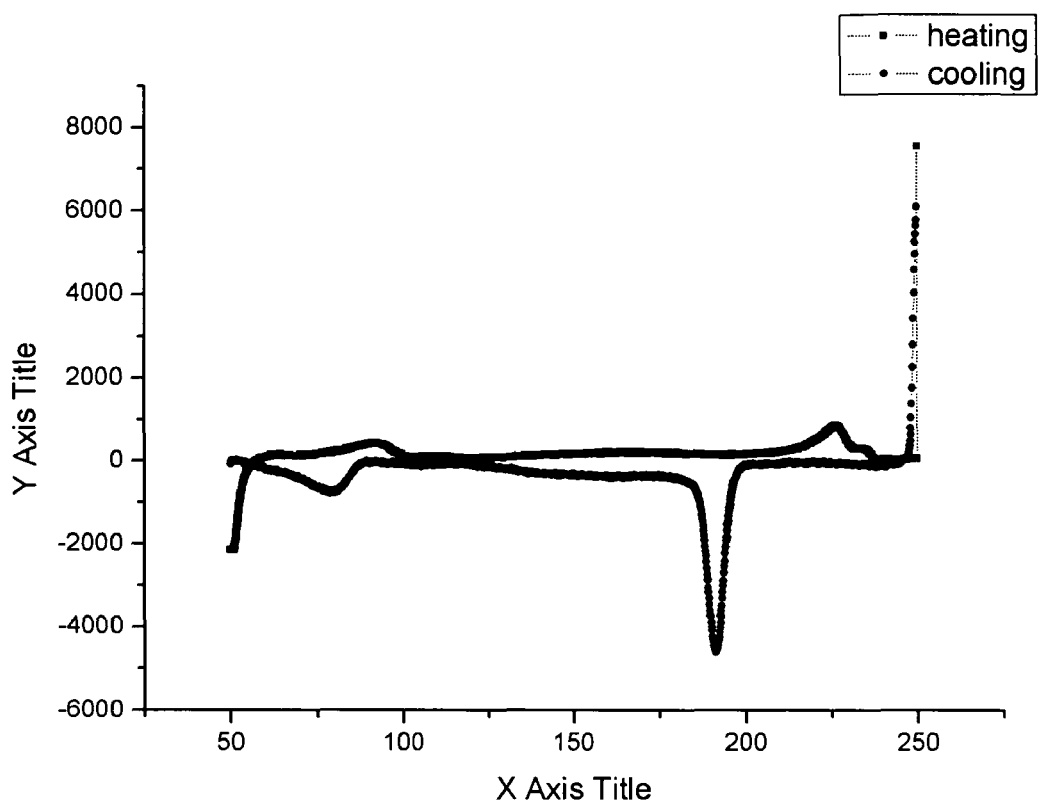
Figure 3:
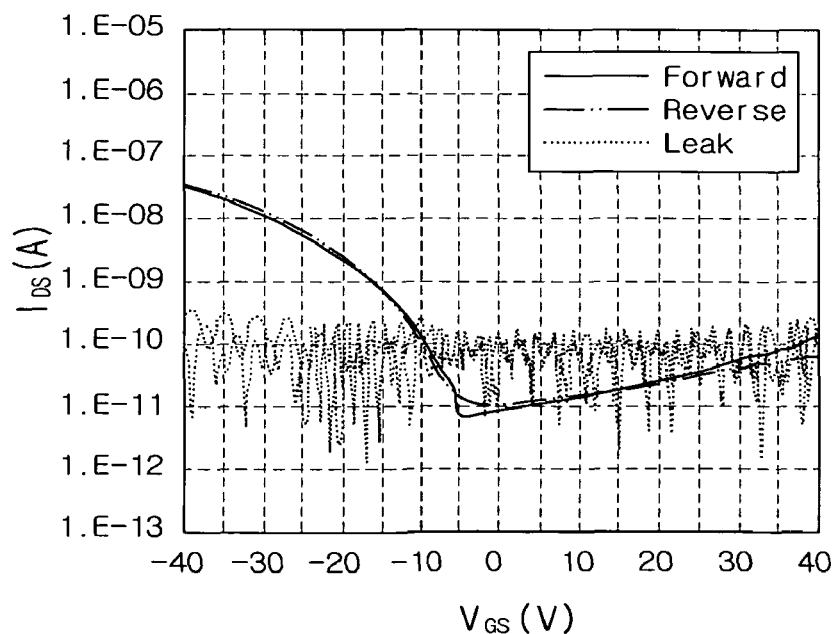

FIG. 2 is a graph illustrating the results of DSC (Differential Scanning Calorimetry) of the organic semiconductor polymer obtained in the preparative example of example embodiments, and FIG. 3 is a graph illustrating the current transfer properties of the device fabricated in the example of example embodiments.

As illustrated in FIG. 2, the polymer may exhibit liquid crystal properties because it had two phase transition temperatures, about 93° C. and about 226° C., when heated, and two phase transfer temperatures, about 80° C. and about 191.8° C., when cooled.

The current transfer properties of the device fabricated in the example were measured using a semiconductor characterization system (4200-SCS), available from KEITHLEY, and graphed in FIG. 3. The electrical properties thereof are given in Table 1 below.

TABLE 1

| Organic Active Layer | Charge Mobility ($cm^2/Vs$) | On-Off Current Ratio | Off-State Leakage Current (A) |
|---|---|---|---|
| Example | 0.002 | $1.1 \times 10^4$ | $1.1 \times 10^{-12}$ |

The charge mobility was calculated from the following current equation for the saturation region. For example, the current equation for the saturation region was converted into a graph relating $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0}{2L}}$$

$$\mu_{FET} = (\text{slope})^2 \frac{2L}{C_0 W}$$

wherein $I_{SD}$ is the source-drain current, $\mu$ or $\mu_{FET}$ is the charge mobility, $C_o$ is the oxide film capacitance, W is the channel width, L is the channel length, $V_G$ is the gate voltage, and $V_T$ is the threshold voltage.

The off-state leakage current ($I_{off}$), which is the current flowing in the off-state, was taken from the minimum current in the off-state of the on/off current ratio.

The on/off current ratio ($I_{on}/I_{off}$) was taken from the ratio of maximum current in the on-state to minimum current in the off-state.

As is apparent from Table 1, the OTFT of the example using the organic semiconductor polymer may have decreased off-state leakage current and increased on/off current ratio and charge mobility.

As described hereinbefore, example embodiments provide an organic semiconductor polymer, a method of preparing the same, and an OTFT using the same. According to example embodiments, the organic semiconductor polymer may include fused thiophenes having liquid crystal properties and N-type aromatic compounds alternately disposed in the main chain thereof, thus exhibiting improved organic solvent solubility, processability, and thin film properties. Further, when the organic semiconductor polymer is applied to the channel layer of the OTFT, increased charge mobility and decreased off-state leakage current may be realized.

Although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. An organic semiconductor polymer, which is represented by Formula 1 below:

Formula 1

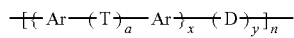

wherein Ar is a $C_{2\sim30}$ heteroaromatic ring containing one or more electron-accepting imine nitrogen atoms, one or more hydrogen atoms of the heteroaromatic ring being substituted with Rs, in which the Rs, which are same as or different from each other, are each a hydroxyl group, a $C_{1\sim20}$ linear, branched or cyclic alkyl group, a $C_{1\sim20}$ alkoxyalkyl group, or a $C_{1\sim16}$ linear, branched or cyclic alkoxy group, T is a group containing about 2~about 6 fused thiophene rings, D is a $C_{4\sim14}$ hetero arylene group containing a hetero atom, other than a nitrogen atom, in an aromatic ring, or a $C_{6\sim30}$ arylene group, a is an integer from about 1 to about 4, x is an integer from about 2 to about 6, y is an integer from about 0 to about 4, and n is an integer from about 4 to about 200.

2. The organic semiconductor polymer as set forth in claim 1, wherein the Ar of Formula 1 is one or more selected from a group represented by Formula 2 below:

Formula 2

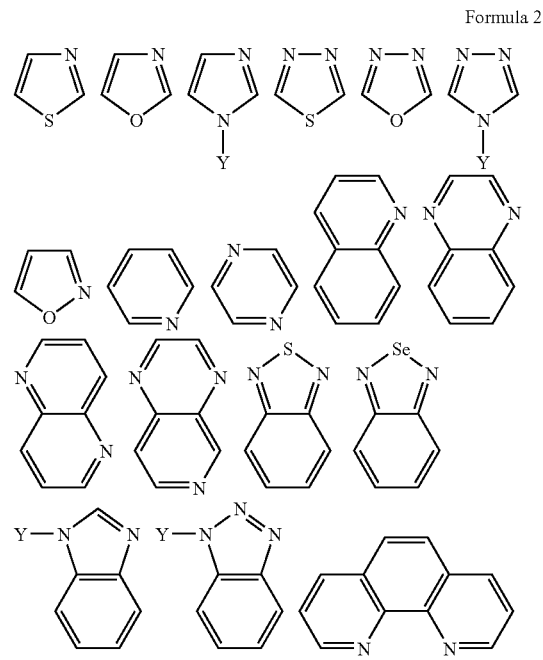

wherein Y is a $C_{1\sim20}$ linear, branched or cyclic alkyl group, an aryl group, or a $C_{1\sim16}$ linear, branched or cyclic alkoxy group.

3. The organic semiconductor polymer as set forth in claim 1, wherein the T of Formula 1 is one or more selected from a group represented by Formula 3 below:

Formula 3

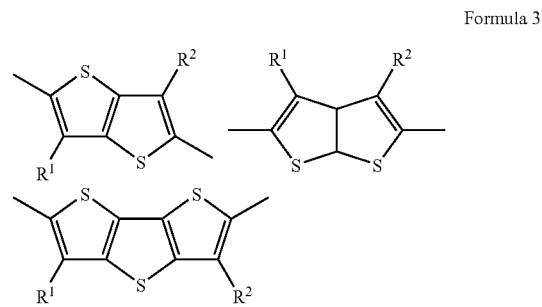

-continued

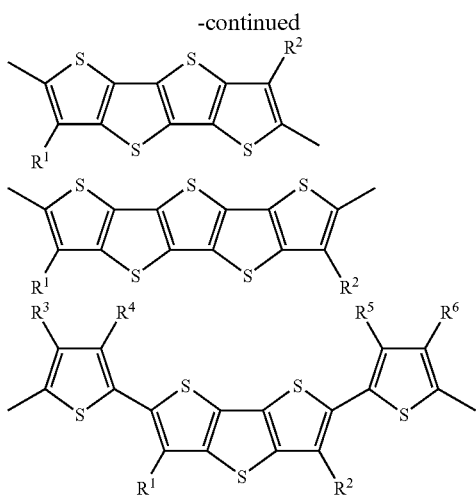

wherein R¹ to R⁶, which are same as or different from each other, are each hydrogen, a hydroxyl group, a $C_{1\sim20}$ linear, branched or cyclic alkyl group, a $C_{1\sim20}$ alkoxyalkyl group, or a $C_{1\sim16}$ linear, branched or cyclic alkoxy group.

4. The organic semiconductor polymer as set forth in claim 1, wherein the hetero arylene group of the D of Formula 1 is a 5-membered hetero arylene group substituted with one or more elements selected from among S, N—H, O, and Se, and the D of Formula 1 is substituted with a hydroxyl group, a $C_{1\sim20}$ linear, branched or cyclic alkyl group, a $C_{1\sim20}$ alkoxyalkyl group, a $C_{1\sim16}$ linear, branched or cyclic alkoxy group, or one or more elements selected from among F, Br, Cl and I.

5. The organic semiconductor polymer as set forth in claim 1, wherein the D of Formula 1 is selected from a group represented by Formula 4 below:

Formula 4

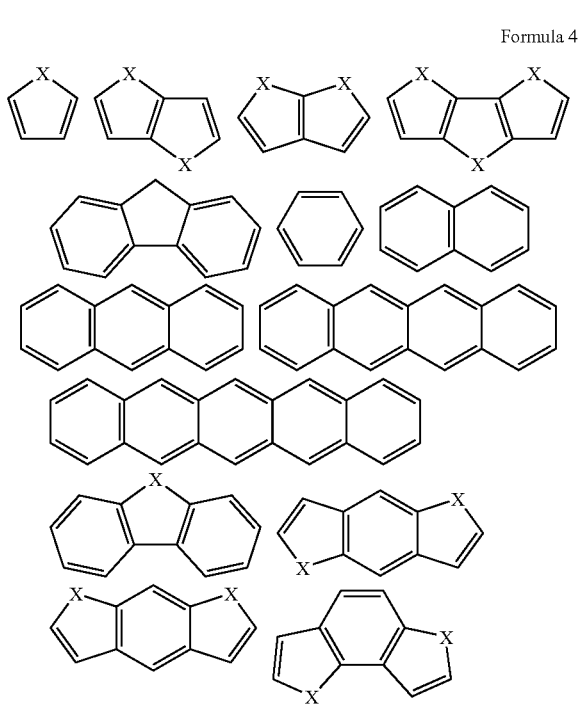

-continued

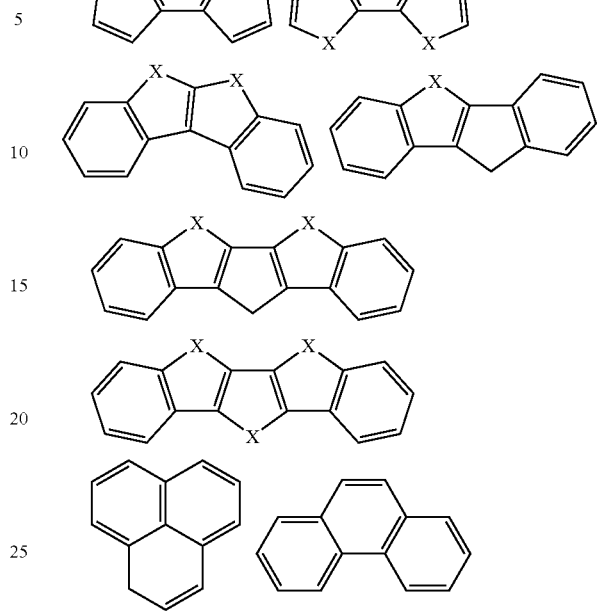

wherein X is S, N—H, O or Se.

6. The organic semiconductor polymer as set forth in claim 1, wherein the organic semiconductor polymer represented by Formula 1 is selected from a group represented by Formula 11 below:

Formula 11

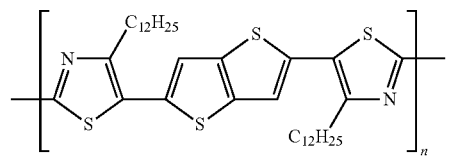

Compound-1

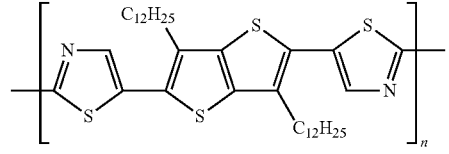

Compound-2

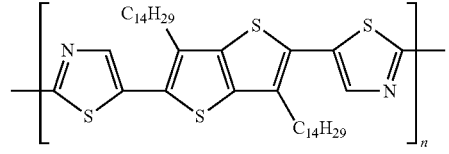

Compound-3

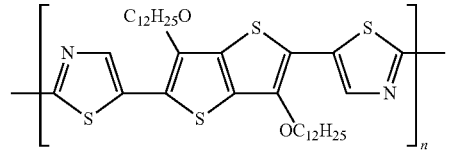

Compound-4

-continued

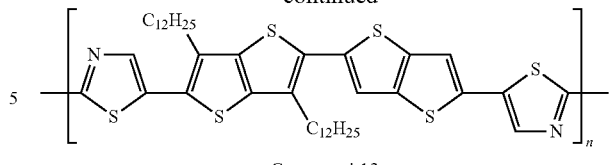

Compound-12

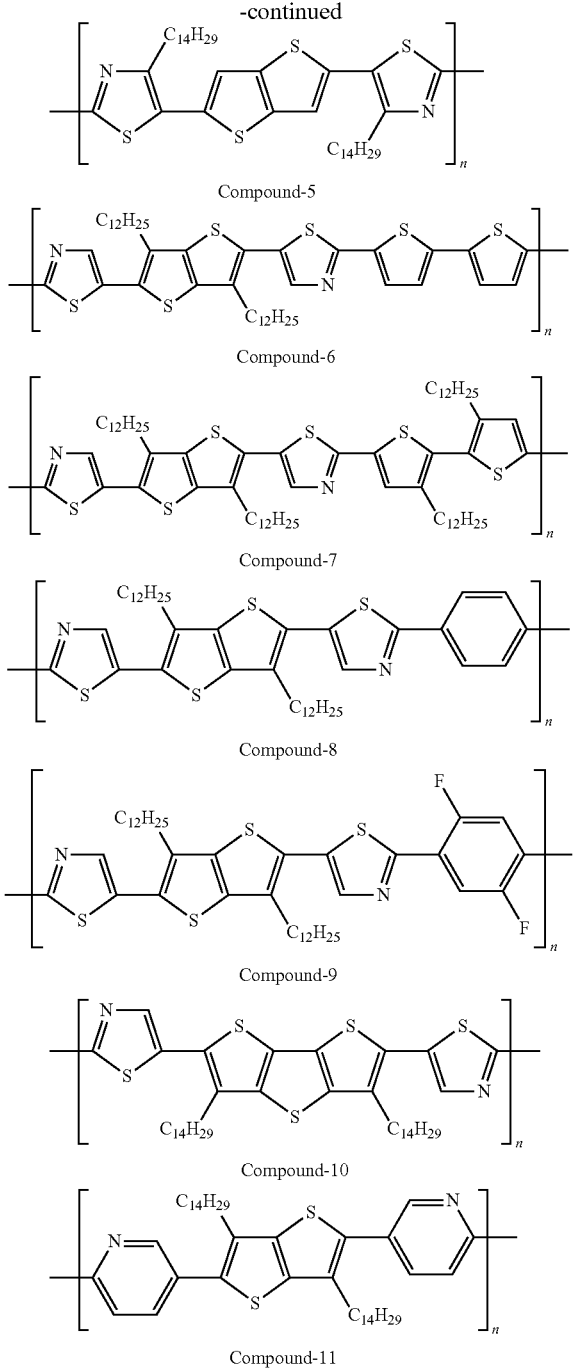

wherein n is an integer from about 4 to about 200.

7. The organic semiconductor polymer of claim 1, wherein the organic semiconductor polymer has a number average molecular weight ranging from about 5,000 to about 100,000.

8. An organic active layer comprising the organic semiconductor polymer according to claim 1.

9. The organic active layer as set forth in claim 8, wherein the organic active layer is formed using a coating process selected from a group consisting of screen printing, printing, spin coating, dipping, and ink jetting.

10. An organic thin film transistor, comprising a substrate, a gate electrode, a gate insulating layer, an organic active layer, and source/drain electrodes, wherein the organic active layer is the organic active layer according to claim 8.

11. The organic thin film transistor as set forth in claim 10, wherein the gate insulating layer is formed of a ferroelectric insulator selected from a group consisting of $Ba_{0.33}Sr_{0.66}TiO_3$(BST), $Al_2O_3$, $Ta_2O_5$, $La_2O_5$, $Y_2O_3$, and $TiO_2$, an inorganic insulator selected from a group consisting of $PbZr_{0.33}Ti_{0.66}O_3$(PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, and AlON, or an organic insulator selected from a group consisting of polyimide, benzocyclobutane (BCB), parylene, polyacrylate, polyvinylalcohol, and polyvinylphenol.

12. The organic thin film transistor as set forth in claim 10, wherein the gate electrode and the source/drain electrodes are formed of a material selected from a group consisting of gold (Au), silver (Ag), aluminum (Al), nickel (Ni), and indium tin oxide (ITO).

13. The organic thin film transistor as set forth in claim 10, wherein the substrate is formed of a material selected from a group consisting of glass, polyethylene naphthalate (PEN), polyethylene terephthalate (PET), polycarbonate, polyvinylalcohol, polyacrylate, polyimide, polynorbornene, and polyethersulfone (PES).

14. An electronic device comprising the organic thin film transistor of claim 10.

15. The electronic device as set forth in claim 14, wherein the electronic device is selected from the group consisting of a photovoltaic device, an organic electroluminescent device, and a sensor.

* * * * *